(12) United States Patent
Lee et al.

(10) Patent No.: US 8,822,110 B2
(45) Date of Patent: Sep. 2, 2014

(54) PHOTOSENSITIVE RESIN COMPOSITION FOR COLOR FILTER AND COLOR FILTER INCLUDING THE SAME

(75) Inventors: Chang-Min Lee, Uiwang-si (KR); Kwang-Seop Kim, Uiwang-si (KR); Hyun-Moo Choi, Uiwang-si (KR); Ho-Jeong Paek, Uiwang-si (KR); Hwan-Sung Cheon, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 13/589,529

(22) Filed: Aug. 20, 2012

(65) Prior Publication Data
US 2013/0143158 A1    Jun. 6, 2013

(30) Foreign Application Priority Data

Dec. 2, 2011    (KR) .......................... 10-2011-0128483

(51) Int. Cl.
G03F 1/00    (2012.01)
G03C 1/00    (2006.01)

(52) U.S. Cl.
USPC ....... 430/7; 430/270.1; 430/280.1; 430/285.1

(58) Field of Classification Search
CPC ....... G03F 7/0007; G03F 7/004; G03F 7/027; G03F 7/038; G03F 7/0045; G02B 5/20; G02B 5/201
USPC .............................. 430/7, 270.1, 280.1, 285.1
See application file for complete search history.

(56) References Cited

U.S. PATENT DOCUMENTS

| | | | |
|---|---|---|---|
| 4,500,897 A | 2/1985 | Matsuda et al. | |
| 4,762,752 A | 8/1988 | Haubennestel et al. | |
| 5,278,009 A | 1/1994 | Iida et al. | |
| 5,424,167 A | 6/1995 | Uetani et al. | |
| 5,663,019 A | 9/1997 | Matsumura et al. | |
| 5,707,432 A | 1/1998 | Adams et al. | |
| 5,708,055 A | 1/1998 | Joyce et al. | |
| 5,710,234 A | 1/1998 | Fujishiro et al. | |
| 5,721,076 A | 2/1998 | Watanabe et al. | |
| 5,803,959 A | 9/1998 | Johnson et al. | |
| 5,851,280 A | 12/1998 | Belmont et al. | |
| 5,876,895 A | 3/1999 | Hishiro et al. | |
| 5,895,522 A | 4/1999 | Belmont et al. | |
| 5,922,118 A | 7/1999 | Johnson et al. | |
| 5,968,243 A | 10/1999 | Belmont et al. | |
| 5,998,091 A | 12/1999 | Suzuki | |
| 6,110,994 A | 8/2000 | Cooke et al. | |
| 6,232,025 B1 | 5/2001 | Srinivasan | |
| 6,277,183 B1 | 8/2001 | Johnson et al. | |
| 6,328,894 B1 | 12/2001 | Chan et al. | |
| 6,780,389 B2 | 8/2004 | Karl et al. | |
| 6,960,250 B2 | 11/2005 | Luethge et al. | |
| 7,132,154 B2 | 11/2006 | Shibahara et al. | |
| 7,250,209 B2 | 7/2007 | Shibahara et al. | |
| 7,376,328 B2 | 5/2008 | Takase et al. | |
| 7,592,119 B2 | 9/2009 | Nomura | |
| 7,794,917 B2 | 9/2010 | Mori et al. | |
| 7,851,789 B2 | 12/2010 | Lee et al. | |
| 2002/0187412 A1 | 12/2002 | You et al. | |
| 2004/0126592 A1 | 7/2004 | Shibahara et al. | |
| 2005/0164120 A1 | 7/2005 | Yamaoka et al. | |
| 2006/0041053 A1 | 2/2006 | Kamata et al. | |
| 2007/0101903 A1 | 5/2007 | Lee et al. | |
| 2007/0161110 A1 | 7/2007 | Iida et al. | |
| 2008/0090177 A1 | 4/2008 | Oh et al. | |
| 2009/0207490 A1 | 8/2009 | Moriyama et al. | |
| 2010/0085518 A1 | 4/2010 | Choi et al. | |
| 2010/0163811 A1 | 7/2010 | Oh et al. | |
| 2010/0227178 A1 | 9/2010 | Oouchi et al. | |
| 2012/0161088 A1* | 6/2012 | Choi et al. ................... | 252/586 |

FOREIGN PATENT DOCUMENTS

| | | |
|---|---|---|
| CN | 1606597 | 4/2005 |
| CN | 1606600 | 4/2005 |
| CN | 101452208 A | 6/2009 |
| EP | 0725315 A2 | 8/1996 |

(Continued)

OTHER PUBLICATIONS

English Translation of JP-2009265527A.*

(Continued)

*Primary Examiner* — Stewart Fraser
(74) *Attorney, Agent, or Firm* — Additon, Higgins & Pendleton, P.A.

(57) ABSTRACT

Disclosed is a photosensitive resin composition for a color filter that includes (A) an acrylic-based copolymer including a structural unit represented by the following Chemical Formula 1, wherein $R^1$, $R^2$, Q, and n are the same as defined in the specification; (B) an acrylic-based photopolymerizable monomer; (C) a photopolymerization initiator; (D) a colorant; and (E) a solvent.

[Chemical Formula 1]

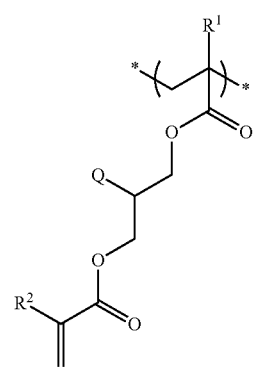

9 Claims, No Drawings

(56) References Cited

FOREIGN PATENT DOCUMENTS

| | | |
|---|---|---|
| EP | 1471112 A1 | 10/2004 |
| JP | 60237403 | 11/1985 |
| JP | 1152449 | 6/1989 |
| JP | 1200353 | 8/1989 |
| JP | 4007373 | 1/1992 |
| JP | 4091173 | 3/1992 |
| JP | 4163552 | 6/1992 |
| JP | 05-339356 A | 12/1993 |
| JP | 06-001938 A | 1/1994 |
| JP | 07-064281 A | 3/1995 |
| JP | 07-64282 | 3/1995 |
| JP | 07-140654 A | 6/1995 |
| JP | 08-278630 A | 10/1996 |
| JP | 09-022653 A | 1/1997 |
| JP | 09-291224 | 11/1997 |
| JP | 09-304929 | 11/1997 |
| JP | 10-010311 A | 1/1998 |
| JP | 10-067970 | 3/1998 |
| JP | 10-204321 A | 8/1998 |
| JP | 10218973 | 8/1998 |
| JP | 10-253820 A | 9/1998 |
| JP | 10-254133 A | 9/1998 |
| JP | 10-510861 | 10/1998 |
| JP | 11-060989 A | 3/1999 |
| JP | 11231523 A | 8/1999 |
| JP | 2000-056120 | 2/2000 |
| JP | 2000-171969 A | 6/2000 |
| JP | 2001-131241 | 5/2001 |
| JP | 2002-145999 | 5/2002 |
| JP | 3287661 B2 | 6/2002 |
| JP | 2003-066597 | 3/2003 |
| JP | 2003-149810 | 5/2003 |
| JP | 2004-004762 A | 1/2004 |
| JP | 2004-029745 A | 1/2004 |
| JP | 2004-186227 | 7/2004 |
| JP | 2004-198717 A | 7/2004 |
| JP | 2004-251946 A | 9/2004 |
| JP | 2004-292672 A | 10/2004 |
| JP | 2004-075985 A | 11/2004 |
| JP | 2005-215149 | 8/2005 |
| JP | 2009-265527 A | 11/2009 |
| JP | 2009265527 A * | 11/2009 |
| KR | 1019910004717 | 7/1991 |
| KR | 1019920005780 | 7/1992 |
| KR | 1992-7002502 | 9/1992 |
| KR | 1993-7000858 | 3/1993 |
| KR | 1994-0005617 | 6/1994 |
| KR | 94-7778 | 8/1994 |
| KR | 1995-7000359 | 1/1995 |
| KR | 10-1995-7002313 | 6/1995 |
| KR | 1995-0011163 | 9/1995 |
| KR | 1995-7003746 | 9/1995 |
| KR | 1996-0029904 | 8/1996 |
| KR | 96-11513 | 1/1999 |
| KR | 93-700858 | 7/2000 |
| KR | 10-0264691 | 9/2000 |
| KR | 95-700359 | 1/2001 |
| KR | 92-702502 | 12/2002 |
| KR | 2003-057090 | 7/2003 |
| KR | 96-29904 | 5/2004 |
| KR | 2005-0094163 A | 9/2005 |
| KR | 10-2006-0041154 A | 5/2006 |
| KR | 2006-70772 A | 6/2006 |
| KR | 10-2006-0076412 A | 7/2006 |
| KR | 10-0725023 B1 | 5/2007 |
| KR | 10-2008-0077435 A | 8/2008 |
| KR | 10-2009-0026037 A | 3/2009 |
| KR | 2009-0061878 A | 6/2009 |
| KR | 2009-0066076 A | 6/2009 |
| KR | 2009-0074432 A | 7/2009 |
| KR | 10-2010-0047648 A | 5/2010 |
| KR | 10-2010-0053090 A | 5/2010 |
| KR | 10-2010-0053476 A | 5/2010 |
| KR | 2010-0068514 A | 6/2010 |
| KR | 10-2010-0089589 A | 8/2010 |
| KR | 10-2011-0035940 A | 4/2011 |
| KR | 10-2011-0069468 A | 6/2011 |
| KR | 2011-0073372 A | 6/2011 |
| TW | 200540565 | 12/2005 |
| WO | 2004/055597 A1 | 7/2004 |
| WO | 2006/044676 A2 | 4/2006 |
| WO | 2008047992 A1 | 4/2008 |
| WO | 2010/050650 A | 5/2010 |

OTHER PUBLICATIONS

Office Action in commonly owned U.S. Appl. No. 12/504,409 mailed on Nov. 18, 2010, pp. 1-12.
Taiwanese Office Action in commonly owned Taiwanese Application No. 095144145 dated Jun. 4, 2010, pp. 1-5.
English translation of Taiwanese Search Report in commonly owned Taiwanese Application No. 095144145 dated May 11, 2010, pp. 1.
Office Action in commonly owned U.S. Appl. No. 12/323,554 mailed Dec. 29, 2009, pp. 1-18.
Office Action in commonly owned U.S. Appl. No. 13/161,542 mailed Jan. 6, 2012, pp. 1-14.
Office Action in commonly owned U.S. Appl. No. 13/241,434 mailed Jan. 23, 2012, pp. 1-19.
Office Action in commonly owned U.S. Appl. No. 11/747,313 mailed on Dec. 22, 2010, pp. 1-4.
Office Action in commonly owned U.S. Appl. No. 11/473,876, mailed on Dec. 18, 2008, pp. 1-14.
Notice of Allowance in commonly owned U.S. Appl. No. 11/473,876, mailed on Jul. 17, 2009, pp. 1-6.
Internationsl Search Report in commonly owned International Application No. PCT/KR2007/002908, dated Sep. 21, 2007, pp. 1-2.
English Translation of Abstract for Korean Patent Application No. 92-702502.
English Translation of Abstract for Korean Patent Application No. 93-700858.
English Translation of Abstract for Korean Patent Application No. 94-7778.
English Translation of Abstract for Korean Patent Application No. 95-11163.
English Translation of Abstract for Korean Patent Application No. 95-700359.
English Translation of Abstract for Korean Patent Application No. 95-703746.
English Translation of Abstract for Korean Patent Application No. 96-11513.
English Translation of Abstract for Korean Patent Application No. 96-29904.
Machine Translation of JP 07064282 A, pp. 1-23.
Machine Translation of KR 2003057090 A, pp. 1-14.
Office Action in commonly owned copending U.S. Appl. No. 12/323,554, mailed on Jun. 24, 2009, pp. 1-25.
English abstract of JP 2004-292672, published Oct. 21, 2004, pp. 1-3.
English abstract of JP 10-204321, published Aug. 4, 1998, pp. 1-3.
English abstract of JP 2004-251946, published Sep. 9, 2004, pp. 1-4.
English abstract of JP 2004-029745, published Jan. 29, 2004, pp. 1-4.
English abstract of JP 2004-004762, published Jan. 8, 2004, pp. 1-4.
English abstract of JP 2004-075985, published Mar. 11, 2004, pp. 1-5.
English abstract of JP 2004-198717, published Jul. 15, 2004, pp. 1-6.
English abstract of JP 10-253820, published Sep. 25, 1998, pp. 1-3.
English abstract of JP 10-010311, published Jan. 16, 1998, pp. 1-3.
English abstract of JP 11-060989, published Mar. 5, 1999, pp. 1-2.
English abstract of JP 09-022653, published Jan. 21, 1997, pp. 1-2.
Office Action in commonly owned U.S. Appl. No. 11/747,313 mailed Jun. 13, 2011, pp. 1-6.
Office Action in commonly owned U.S. Appl. No. 11/747,313 mailed Nov. 23, 2011, pp. 1-6.
Search Report in counterpart Taiwanese Application No. 101127768 dated Feb. 24, 2014, pp. 1.
English-translation of Search Report in counterpart Taiwanese Application No. 101127768 dated Feb. 24, 2014, pp. 1.

* cited by examiner

PHOTOSENSITIVE RESIN COMPOSITION FOR COLOR FILTER AND COLOR FILTER INCLUDING THE SAME

CROSS-REFERENCE TO RELATED APPLICATION

This application claims priority to and the benefit of Korean Patent Application No. 10-2011-0128483 filed in the Korean Intellectual Property Office on Dec. 2, 2011, the entire disclosure of which is incorporated herein by reference.

FIELD

This disclosure relates to a photosensitive resin composition for a color filter and a color filter using the same.

BACKGROUND

Color filters can be used for liquid crystal displays (LCDs), optical filters for cameras, and the like. Color filters can be fabricated by coating a fine region colored with three or more colors on a charge coupled device or a transparent substrate. The colored thin film can be fabricated by dyeing, printing, electrophoretic deposition (EPD), pigment dispersion, and the like.

Color filters can be subject to many chemical treatments during the manufacturing process. Accordingly, in order to maintain a pattern formed under the aforementioned conditions, a color photosensitive resin is required to have a development margin and also chemical resistance to improve yield of a color filter.

A conventional color liquid crystal display (LCD) is generally fabricated by preparing a color filter substrate for displaying a color image separately from an operating substrate on which a thin film transistor (TFT) is disposed and then, binding the color filter substrate and the operating substrate together. However, since there can be low arrangement accuracy during the binding step, conventional color liquid crystal displays can require a shading layer with a large width. Accordingly, it can be difficult to increase the aperture ratio (a ratio of an opening to transmit light). In addition, as glass substrates used in the manufacture of LCDs and LCD screens have recently become larger, it can take a longer time for a liquid crystal composition to be disposed over the front side of the substrates during vacuum injection of a liquid crystal.

A method has been suggested to sharply decrease the time needed for printing a seal material and dripping a liquid crystal to form an over-coat. The method, however, can result in sharply deteriorated arrangement accuracy.

Another method of forming a color filter on the operating TFT array substrate of a TFT color liquid crystal display (LCD) has been suggested. Since this method does not need a color filter substrate and fabricates a transparent substrate through sputtering and binding two substrates, it has an advantage of simplifying the arrangement and increasing an aspect rate.

However, when a color filter is formed on a TFT array substrate, a pixel electrode is formed on the color filter in a photolithography method by using a common positive photoresist. Accordingly, the resist layer needs to be removed after forming the electrode. In other words, a pixel electrode is formed by forming a transparent electrode layer on color pixels of a color filter, coating a positive resist composition thereon, and patterning it, exposing it to light, and developing it. Then, the resist layer remaining on the pixel electrode should be peeled and removed with a resist stripper. Accordingly, the positive resist composition requires resistance against the resist stripper. Conventional photosensitive resin compositions, however, typically have weak resistance against a resist stripper.

Conventionally, a pixel electrode is fabricated by forming a transparent layer (a pixel protective layer) having stripper-resistance on a color filter. In addition, a pixel electrode can be fabricated without coating a pixel protective layer by treating a stripper at a low temperature for a longer time to decrease the stripper's influence on a color filter. However, these conventional methods have problems of deteriorating yield rate and production efficiency, since they require more processes and longer times.

In order to solve these problems, another method has been suggested, which includes using a radiation-sensitive composition with an expansion rate of less than 5% against a stripper to remove a cured layer forming a color layer in a COA (color filter on array) method. Further, a color filter can have improved thermal polymerization cross-linking effects by using a multi-functional alicyclic epoxy compound as a thermal polymerization cross-linking agent and a benzophenone-based peroxide as a thermal polymerization initiator. According to this method, a color filter can be cured at a low temperature for a short time and thereby can have excellent durability and close contacting (adhesion) properties. However, as the demand increases for larger screens with higher image quality than can be produced using conventional methods, there is also an increased need for a color filter with a higher aperture ratio and improved performance.

SUMMARY

One embodiment provides a photosensitive resin composition for a color filter that can have excellent sensitivity and heat resistance.

Another embodiment provides a color filter that can have a high aperture ratio and a high contrast ratio, and which is capable of realizing a black matrix having a high optical density.

According to one embodiment, a photosensitive resin composition for a color filter is provided that includes (A) an acrylic-based copolymer including a structural unit represented by the following Chemical Formula 1; (B) an acrylic-based photopolymerizable monomer; (C) a photopolymerization initiator; (D) a colorant; and (E) a solvent.

[Chemical Formula 1]

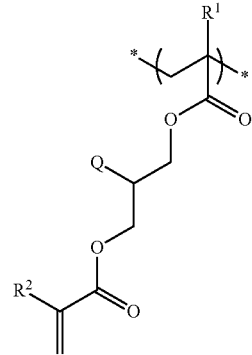

In Chemical Formula 1, $R^1$ and $R^2$ are the same or different and are each independently hydrogen or substituted or unsubstituted C1 to C30 alkyl, and Q is represented by the following Chemical Formula 2,

[Chemical Formula 2]

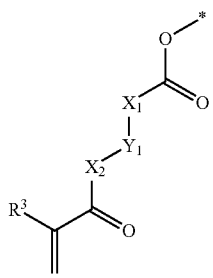

In Chemical Formula 2, $R^3$ is hydrogen or substituted or unsubstituted C1 to C30 alkyl, $Y_1$ is C1 to C30 alkylene, and $X_1$ and $X_2$ are the same or different and are each independently —O—, —N(H)—, or —S—.

The photosensitive resin composition for a color filter may include (A) about 1 wt % to about 50 wt % of the acrylic-based copolymer including the structural unit represented by the above Chemical Formula 1; (B) about 0.5 wt % to about 20 wt % of the acrylic-based photopolymerizable monomer; (C) about 0.1 to about 10 wt % of the photopolymerization initiator; (D) about 0.1 wt % to about 40 wt % of the colorant; and (E) balance of the solvent.

The acrylic-based copolymer (A) may have a weight average molecular weight (Mw) of about 3,000 to about 500,000.

The acrylic-based copolymer (A) including the structural unit represented by the above Chemical Formula 1 may have an acid value of about 20 to about 200 mgKOH/g.

The photosensitive resin composition for a color filter may further include one or more additives. Examples of additives include without limitation dispersing agents, epoxy compounds, malonic acid, 3-amino-1,2-propanediol, silane-based coupling agents including a vinyl group or a (meth)acryloxy group, leveling agents, silicon-based surfactants, fluorine-based surfactants, radical polymerization initiators, and the like, and mixtures thereof.

The photosensitive resin composition for a color filter may further include a cardo-based polymer including a structural unit represented by the following Chemical Formula 3, along with the acrylic-based copolymer (A).

-[A]$_m$-[B]$_n$—      [Chemical Formula 3]

In Chemical Formula 3, m and n are the same or different and are each independently an integer ranging from 1 to 100, A is represented by the following Chemical Formula 4, and B is represented by the following Chemical Formula 5.

In Chemical Formula 4, $R^4$ to $R^7$ are the same or different and are each independently hydrogen, C1 to C30 alkyl, or halogen, and $R^8$ and $R^9$ are the same or different and are each independently hydrogen or methyl, $X_3$ is

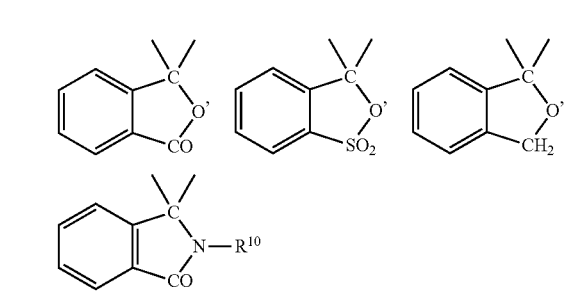

(wherein, $R^{10}$ is hydrogen, ethyl, —$C_2HCl$, $C_2H_4OH$, —$CH_2CH=CH_2$, or -Phenyl),

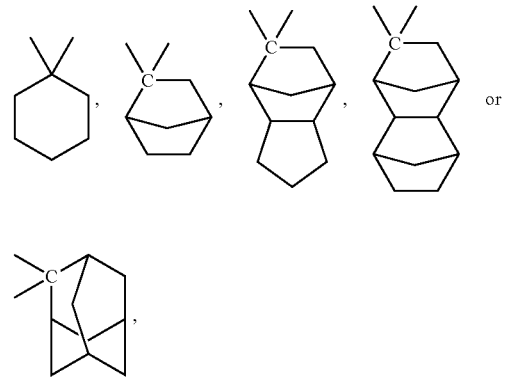

$Y_2$ and $Y_3$ are the same or different and are each independently —O—, —$NR^{11}$— (wherein $R^{11}$ is hydrogen, methyl, ethyl, —$CH_2OH$, —$C_2H_4OH$, or —$CH_2CH=CH_2$), or —C(=O)O—, and $Z_1$ is an acid monoanhydride derivative or an acid dianhydride derivative.

[Chemical Formula 4]

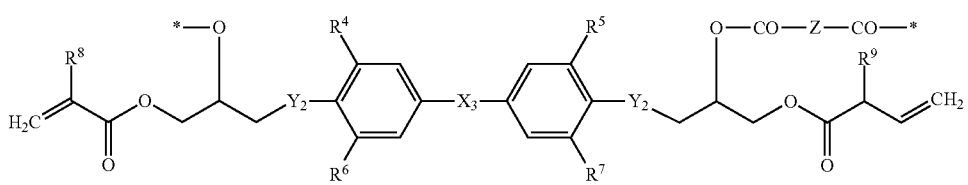

[Chemical Formula 5]

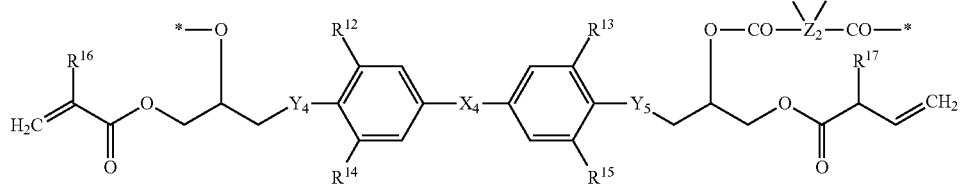

In Chemical Formula 5, $R^{12}$ to $R^{15}$ are the same or different and are each independently hydrogen, C1 to C30 alkyl, or halogen, $R^{16}$ and $R^{17}$ are the same or different and are each independently hydrogen or methyl, $X_4$ is

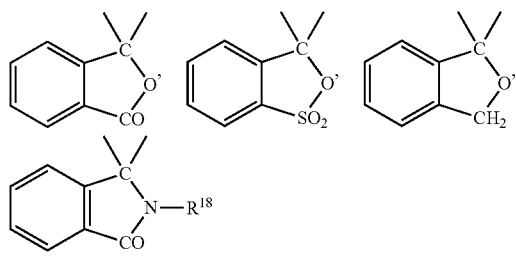

(wherein $R^{18}$ is hydrogen, ethyl, —$C_2H_4Cl$, $C_2H_4OH$, —$CH_2CH=CH_2$, or -Phenyl),

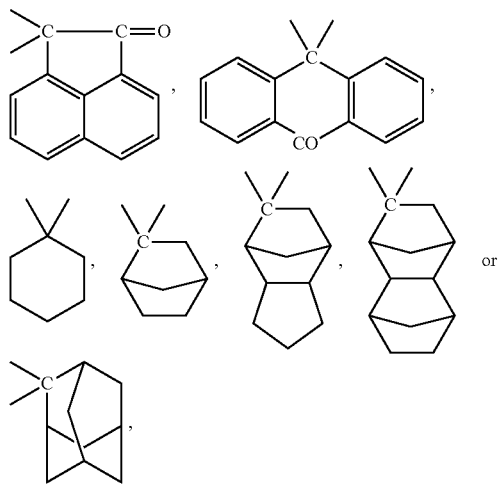

$Y_4$ and $Y_5$ are the same or different and are each independently —O—, —$NR^{19}$— (wherein $R^{19}$ is hydrogen, methyl, ethyl, —$CH_2OH$, —$C_2H_4OH$, or —$CH_2CH=CH_2$), or —C(=O)O—, and $Z_2$ is an acid monoanhydride derivative or an acid dianhydride derivative.

The cardo-based polymer including a structural unit represented by the above Chemical Formula 3 may have a weight average molecular weight (Mw) of about 500 to about 30,000.

The cardo-based polymer may be included in an amount of about 1 wt % to about 50 wt % based on the total amount (weight) of the photosensitive resin composition for a color filter.

According to another embodiment, a color filter manufactured using the photosensitive resin composition for a color filter is provided.

The photosensitive resin composition for a color filter including the acryl-based copolymer may have a high crosslinking degree, and thus it may provide a color filter with high sensitivity and high heat resistance, and it may also provide a black matrix with high optical density while accomplishing a high aperture ratio and a high contrast ratio.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "alkyl" may refer to C1 to C30 alkyl, the term "aryl" may refer to C6 to C30 aryl, the term "arylalkyl" may refer to C7 to C30 arylalkyl, the term "alkylene" may refer to C1 to C20 alkylene, and the term "alkoxylene" may refer to C1 to C20 alkoxylene.

As used herein, when a specific definition is not otherwise provided, the term "substituted" may refer to one substituted with a substituent including halogen (F, Cl, Br, or I), a hydroxyl group, a nitro group, a cyano group, an imino group (=NH, =NR, wherein R is C1 to C10 alkyl), an amino group (—$NH_2$, —NH(R'), —N(R")(R'''), wherein R' to R''' are the same or different and are each independently C1 to C10 alkyl), an amidino group, a hydrazine or hydrazone group, a carboxyl group, substituted or unsubstituted C1 to C30 alkyl, substituted or unsubstituted C6 to C30 aryl, substituted or unsubstituted C1 to C30 cycloalkyl, substituted or unsubstituted C1 to C30 heteroaryl, substituted or unsubstituted C2 to C30 heterocycloalkyl, or a combination thereof, instead of at least one hydrogen in a functional group.

As used herein, when a specific definition is not otherwise provided, the term "hetero" may refer to one substituted with at least one atom including N, O, S, P, or a combination thereof.

As used herein, the "*" may refer to points where the same or different atom or Chemical Formula is connected.

One embodiment provides acrylic-based copolymer including a structural unit represented by the following Chemical Formula 1.

[Chemical Formula 1]

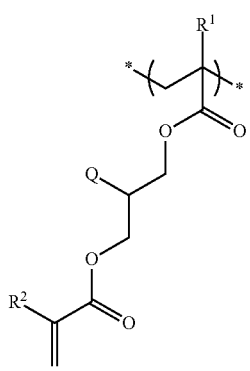

In Chemical Formula 1, $R^1$ and $R^2$ are the same or different and are each independently hydrogen or substituted or unsubstituted C1 to C30 alkyl, and Q is represented by the following Chemical Formula 2,

[Chemical Formula 2]

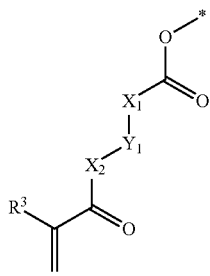

In Chemical Formula 2, $R^3$ is hydrogen or substituted or unsubstituted C1 to C30 alkyl, $Y_1$ is C1 to C30 alkylene, $X_1$ and $X_2$ are the same or different and are each independently —O—, —N(H)—, or —S—.

By using the acrylic-based copolymer including a structural unit represented by Chemical Formula 1 together with an acrylic-based photopolymerizable monomer having the similar structure to provide a photosensitive resin composition, the degree of cross-linking may be increased, and pattern forming properties may be improved.

A photosensitive resin composition for a color filter according to another embodiment includes (A) an acrylic-based copolymer including a structural unit represented by the following Chemical Formula 1; (B) an acrylic-based photopolymerizable monomer; (C) a photopolymerization initiator; (D) a colorant; and (E) a solvent.

[Chemical Formula 1]

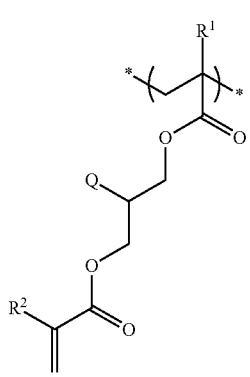

In Chemical Formula 1, $R^1$ and $R^2$ are the same or different and are each independently hydrogen or substituted or unsubstituted C1 to C30 alkyl, and Q is represented by the following Chemical Formula 2,

[Chemical Formula 2]

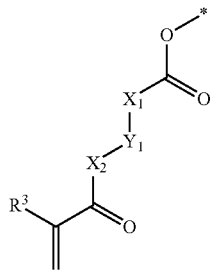

In Chemical Formula 2, $R^3$ is hydrogen or substituted or unsubstituted C1 to C30 alkyl, $Y_1$ is C1 to C30 alkylene, $X_1$ and $X_2$ are the same or different and are each independently —O—, —N(H)—, or —S—.

The photosensitive resin composition for a color filter including the acrylic-based copolymer (A) can have excellent sensitivity and heat resistance, and thus can realize a color filter having a high aperture ratio and a high contrast ratio, and a black matrix having a high optical density.

Hereinafter, the components of the photosensitive resin composition for a color filter are illustrated in detail.

(A) Acrylic-Based Copolymer Including a Structural Unit Represented by Chemical Formula 1

[Chemical Formula 1]

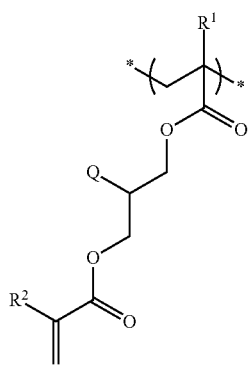

In Chemical Formula 1, $R^1$ and $R^2$ are the same or different and are each independently hydrogen or substituted or unsubstituted C1 to C30 alkyl, and Q is represented by the following Chemical Formula 2,

[Chemical Formula 2]

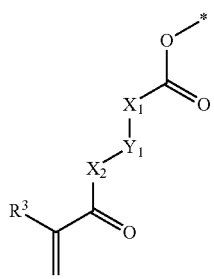

In Chemical Formula 2, $R^3$ is hydrogen or substituted or unsubstituted C1 to C30 alkyl, $Y_1$ is C1 to C30 alkylene, $X_1$ and $X_2$ are the same or different and are each independently —O—, —N(H)—, or —S—.

Because the acrylic-based copolymer including a structural unit represented by Chemical Formula 1 can have a similar structure to the photo-reactive functional group included in the following acrylic-based photopolymerizable monomer, a cross-linking bond may occur during photopolymerization in the resin composition when a radical is generated by the photopolymerization initiator, which will be described hereinafter.

In addition, Q included in above Chemical Formula 1 includes a plurality of double bonds as indicated in Chemical Formula 2. Accordingly, the photosensitive resin composition for a color filter including the acrylic-based copolymer (A) may have a high degree of cross-linking (photo cross-linking degree) in the photopolymerization induced by the photopolymerization initiator. When the photosensitive resin composition has a high degree of cross-linking, the data bias may be easily controlled, and the uniformity of pattern line width and the pattern shape may be optimized on the photomask.

The acrylic-based copolymer may include the structural unit represented by Chemical Formula 1 in an amount of about 0.05 to about 50 wt %, for example about 0.1 to about 30 wt %, based on the total amount (weight) of the acrylic-based copolymer. In some embodiments, the acrylic-based copolymer may include the structural unit represented by Chemical Formula 1 in an amount of about 0.05, 0.06, 0.07, 0.08, 0.09, 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the structural unit represented by Chemical Formula 1 can be in a range from about any of the foregoing amounts to about any other of the foregoing amounts.

When the acrylic-based copolymer includes the structural unit represented by Chemical Formula 1 in an amount within the above ranges, patterning, developability, and heat resistance may be improved.

The acrylic-based copolymer including a structural unit represented by Chemical Formula 1 may have a weight average molecular weight (Mw) of about 3,000 to about 500,000, for example about 5,000 to about 50,000.

The acrylic-based copolymer including a structural unit represented by Chemical Formula 1 may have an acid value of about 20 to about 200 mg KOH/g, for example about 40 to about 200 mg KOH/g.

When the acrylic-based copolymer including a structural unit represented by Chemical Formula 1 has a weight average molecular weight and an acid value within the above ranges, excellent developability may be realized.

The acrylic-based copolymer including a structural unit represented by Chemical Formula 1 may further include a structural unit derived from a first ethylenic unsaturated monomer and a structural unit derived from an ethylenic unsaturated monomer being capable of being copolymerized with the first ethylenic unsaturated monomer, along with the structural unit represented by Chemical Formula 1.

The first ethylenic unsaturated monomer may be an ethylenic unsaturated monomer including at least one carboxyl group. Examples of the first ethylenic unsaturated monomer may include, without limitation, acrylic acid, methacrylic acid, maleic acid, itaconic acid, fumaric acid, and the like, and combinations thereof.

The acrylic-based copolymer including a structural unit represented by Chemical Formula 1 may include a first ethylenic unsaturated monomer in an amount of about 1 to about 50 wt %, for example about 3 to about 40 wt %, and as another example about 5 to about 30 wt %, based on the total weight of the monomer(s) constituting the copolymer. In some embodiments, the acrylic-based binder resin may include the first ethylenic unsaturated monomer in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the first ethylenic unsaturated monomer can be in a range from about any of the foregoing amounts to about any other of the foregoing amounts.

Examples of the second ethylenic unsaturated monomer may include without limitation alkenyl aromatic monomers, unsaturated carbonic acid ester compounds, unsaturated carbonic acid amino alkyl ester compounds, carbonic acid vinyl ester compounds, unsaturated carbonic acid glycidyl ester compounds, vinyl cyanide compounds, unsaturated amide compounds, and the like, and combinations thereof.

Examples of the alkenyl aromatic monomer may include without limitation styrene, α-methyl styrene, vinyl toluene, vinyl benzyl methylether, and the like; examples of the unsaturated carbonic acid ester compound may include without limitation methyl acrylate, methyl methacrylate, ethyl acrylate, ethyl methacrylate, butyl acrylate, butyl methacrylate, 2-hydroxy ethyl acrylate, 2-hydroxy ethyl methacrylate, 2-hydroxy butyl acrylate, 2-hydroxy butyl methacrylate, benzyl acrylate, benzyl methacrylate, cyclohexyl acrylate, cyclohexyl methacrylate, phenyl acrylate, phenyl methacrylate, and the like; examples of the unsaturated carbonic acid amino alkyl ester compound may include without limitation 2-amino ethyl acrylate, 2-amino ethyl methacrylate, 2-dimethyl amino ethyl acrylate, 2-dimethyl amino ethyl methacrylate, and the like; examples of the carbonic acid vinyl ester compound may include without limitation acetic acid vinyl, benzoic acid vinyl, and the like; examples of the unsaturated carbonic acid glycidyl ester compound may include without limitation glycidyl acrylate, glycidyl methacrylate, and the like; examples of the vinyl cyanide compound may include without limitation acrylonitrile, methacrylonitrile, and the like; and examples of the unsaturated amide compound may include without limitation acrylamide, methacrylamide, and the like. The unsaturated the second ethylenic unsaturated monomer may be used singularly or in a mixture of two or more.

The amount of the acrylic-based copolymer (A) may be adjusted depending on shapes of a pattern. For example, the photosensitive resin composition may include the acrylic-based copolymer (A) in an amount of about 1 wt % to about 50 wt %, for example about 5 wt % to about 10 wt %, based on the total amount (weight) of the photosensitive resin composition for a color filter. As another example, in order to fabricate a colorless pattern, the photosensitive resin composition may include the acrylic-based copolymer (A) in an amount of about 20 wt % to about 30 wt %, based on the total amount (weight) of the photosensitive resin composition for a color filter. In some embodiments, the photosensitive resin composition may include the acrylic-based copolymer (A) in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the acrylic-based copolymer (A) can be in a range from about any of the foregoing amounts to about any other of the foregoing amounts.

When the acrylic-based copolymer (A) is included in an amount of about 1 to about 50 wt % based on the total amount (weight) of the photosensitive resin composition for a color filter, the composition may have excellent developability for an alkali developing solution, may have reduced surface roughness due to good cross-linking and may have minimal or no pattern peeling due to good chemical resistance.

The photosensitive resin composition for a color filter may further include a cardo-based polymer including a structural unit represented by the following Chemical Formula 3.

-[A]$_m$-[B]$_n$—  [Chemical Formula 3]

In Chemical Formula 3, m and n are the same or different and are each independently an integer ranging from 1 to 100, A is represented by the following Chemical Formula 4, and B is represented by the following Chemical Formula 5.

[Chemical Formula 4]

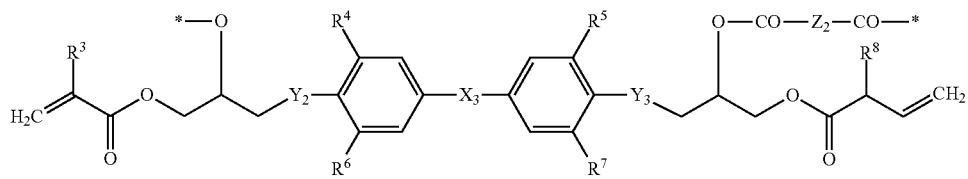

In Chemical Formula 4, $R^4$ to $R^7$ are the same or different and are each independently hydrogen, C1 to C30 alkyl, or halogen, and $R^8$ and $R^9$ are the same or different and are each independently hydrogen or methyl, $X_3$ is

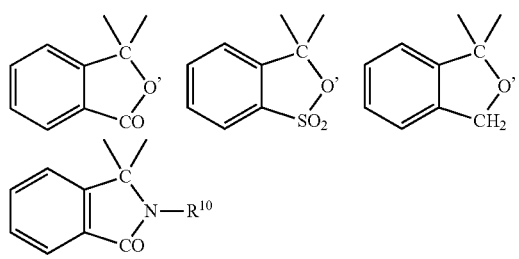

(wherein $R^{10}$ is hydrogen, ethyl, $-C_2H_4Cl$, $-C_2H_4OH$, $-CH_2CH=CH_2$, or -Phenyl),

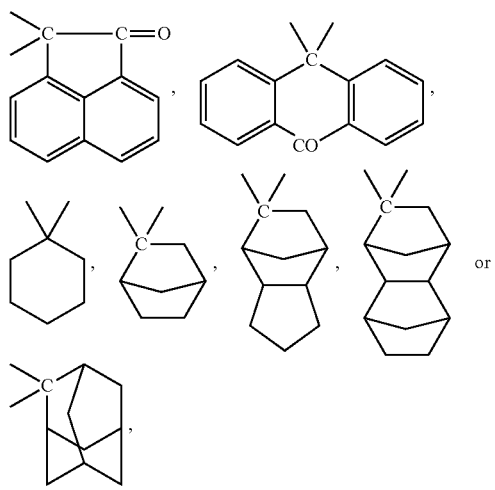

$Y_2$ and $Y_3$ are the same or different and are each independently $-O-$, $-NR^{11}-$ (wherein $R^{11}$ is hydrogen, methyl, ethyl, $-CH_2OH$, $-C_2H_4OH$, or $-CH_2CH=CH2$), or $-C(=O)O-$, and $Z_1$ is an acid monoanhydride derivative or an acid dianhydride derivative.

[Chemical Formula 5]

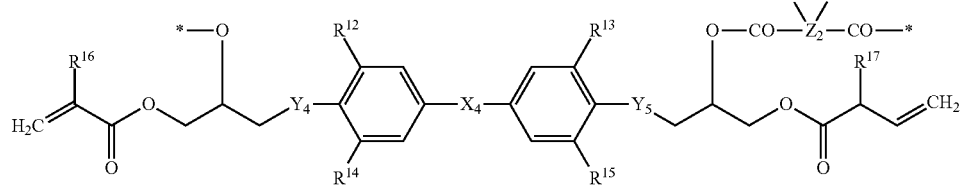

In Chemical Formula 5, $R^{12}$ to $R^{15}$ are the same or different and are each independently hydrogen, C1 to C30 alkyl, or halogen, $R^{16}$ and $R^{17}$ are the same or different and are each independently hydrogen or methyl, $X_4$ is

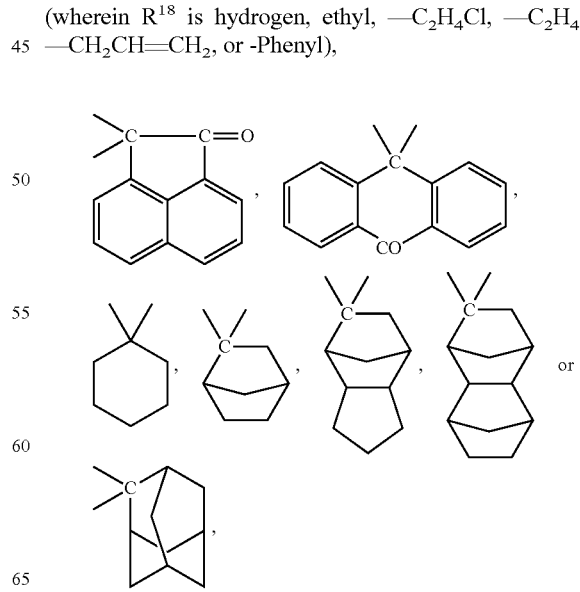

(wherein $R^{18}$ is hydrogen, ethyl, $-C_2H_4Cl$, $-C_2H_4OH$, $-CH_2CH=CH_2$, or -Phenyl), $Y_4$ and $Y_5$ are the same or different and are each independently —O—, —$NR_5$— (wherein $R_5$ is hydrogen, methyl, ethyl, —$CH_2OH$, —$C_2H_4OH$, or —$CH_2CH$=$CH_2$), or —C(=O)O—, and $Z_2$ is an acid monoanhydride derivative or an acid dianhydride derivative.

The cardo-based polymer including a structural unit represented by the above Chemical Formula 3 may have a weight average molecular weight (Mw) of about 500 to about 30,000. When the cardo-based polymer has a weight average molecular weight (Mw) within the above range, a pattern without residues may be formed and there may be minimal or no loss of film thickness during development, which can provide a good pattern.

The photosensitive resin composition may include the cardo-based polymer including a structural unit represented by the above Chemical Formula 3 in an amount of about 1 w % to about 50 wt %, based on the total amount (weight) of the photosensitive resin composition for a color filter. In some embodiments, the photosensitive resin composition may include the cardo-based polymer including a structural unit represented by the above Chemical Formula 3 in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the cardo-based polymer including a structural unit represented by the above Chemical Formula 3 can be in a range from about any of the foregoing amounts to about any other of the foregoing amounts.

When the cardo-based polymer is included in an amount within the above range, the photosensitive resin composition may have high sensitivity and melting properties, which can provide excellent patterning properties.

(B) Acrylic-Based Photopolymerizable Monomer

The acrylic-based photopolymerizable monomer may be any photopolymerizable monomer that may be used in a photosensitive resin composition.

Examples of the photopolymerizable monomer may include without limitation ethyleneglycol di(meth)acrylate, diethyleneglycol di(meth)acrylate, triethyleneglycol di(meth)acrylate, propyleneglycol di(meth)acrylate, 1,4-butanediol di(meth)acrylate, 1,6-hexanediol di(meth)acrylate, neopentylglycol di(meth)acrylate, pentaerythritol di(meth)acrylate, pentaerythritol tri(meth)acrylate, pentaerythritol tetra(meth)acrylate, pentaerythritol penta(meth)acrylate, pentaerythritol hexa(meth)acrylate, dipentaerythritol di(meth)acrylate, dipentaerythritol tri(meth)acrylate, dipentaerythritol tetra(meth)acrylate, dipentaerythritol penta(meth)acrylate, dipentaerythritol hexa(meth)acrylate, bisphenol A di(meth)acrylate, trimethylolpropane tri(meth)acrylate, novolacepoxy(meth)acrylate, a carboxyl group-containing dipentaerythritol penta(meth)acrylate derivative, ethyleneoxide-containing glycerine trimethylolpropanetri(meth)acrylate, propyleneoxide-containing glycerinetri(meth)acrylate, and the like, and combinations thereof.

The photopolymerizable monomer tends to react with a cyclic ether to improve solvent resistance, and in exemplary embodiments the photopolymerizable monomer includes a carboxyl group. Examples of the carboxyl group-containing photopolymerizable monomer may include without limitation esters of a hydroxyl group-containing (meth)acrylate and polyvalent carboxylic acid; esters of a hydroxyl group-containing (meth)acrylate and polyvalent carboxylic acid anhydride; and the like, and combinations thereof.

Examples of the hydroxyl group-containing (meth)acrylate may include without limitation trimethylolpropane di(meth)acrylate, glycerine di(meth)acrylate, pentaerythritol tri(meth)acrylate, dipentaerythritol penta(meth)acrylate, and the like, and combinations thereof.

Examples of the polyvalent carboxylic acid may include without limitation aromatic polyvalent carboxylic acids such as phthalic acid, 3,4-dimethylphthalic acid, isophthalic acid, terephthalic acid, pyromellitic acid, trimellitic acid, 1,4,5,8-naphthalenetetracarboxylic acid, 3,3',4,4'-benzophenonetetracarboxylic acid, and the like; aliphatic polyvalent carboxylic acids such as succinic acid, glutaric acid, sebacic acid, 1,2,3,4-butanetetracarboxylic acid, maleic acid, fumaric acid, itaconic acid, and the like; alicyclic polyvalent carboxylic acids such as hexahydrophthalic acid, 3,4-dimethyltetrahydrophthalic acid, hexahydroisophthalic acid, hexahydroterephthalic acid, 1,2,4-cyclopentanetricarboxylic acid, 1,2,4-cyclohexanetricarboxylic acid, cyclopentanetetracarboxylic acid, 1,2,4,5-cyclohexane, tetracarboxylic acid, and the like; and the like, and combinations thereof.

Examples of the polyvalent carboxylic acid anhydride may include without limitation aromatic polyvalent carboxylic acid anhydrides such as anhydrous phthalic acid, anhydrous pyromellitic acid, anhydrous trimellitic acid, 3,3',4,4'-benzophenonetetracarboxylic acid dianhydride, and the like; aliphatic polyvalent carboxylic acid anhydrides such as itaconic anhydride, anhydrous succinic acid, anhydrous citraconic acid, anhydrous dodecenylsuccinic acid, anhydrous tricarballylic acid, maleic anhydride, 1,2,3,4-butanetetracarboxylic acid dianhydride, and the like; alicyclic polyvalent carboxylic acid anhydrides such as anhydrous hexahydrophthalic acid, 3,4-dimethyltetrahydrophthalic acid anhydride, 1,2,4-cyclopentanetricarboxylic acid anhydride, 1,2,4-cyclohexanetricarboxylic acid anhydride, cyclopentanetetracarboxylic acid dianhydride, 1,2,4,5-cyclohexanetetracarboxylic acid dianhydride, himic anhydride, nadic anhydride, and the like; ester group-containing carboxylic acid anhydrides such as ethyleneglycol bistri mellitic acid, glycerine tristrimellitic anhydride, and the like; and the like, and combinations thereof.

Examples of the carboxyl group-containing photopolymerizable monomer may include without limitation phthalic acid ester of trimethylolpropane di(meth)acrylate, succinic acid ester of glycerine di(meth)acrylate, phthalic acid ester of pentaerythritol tri(meth)acrylate, succinic acid ester of pentaerythritol triacrylate, phthalic acid ester of dipentaerythritol penta(meth)acrylate, succinic acid ester of dipentaerythritol penta(meth)acrylate, and the like, and combinations thereof.

The photosensitive resin composition may include the acrylic-based photopolymerizable monomer in an amount of about 0.5 to about 20 wt % based on the total amount (weight) of the photosensitive resin composition for a color filter. In some embodiments, the photosensitive resin composition may include the acrylic-based photopolymerizable monomer in an amount of about 0.5, 0.6, 0.7, 0.8, 0.9, 1, 2, 3, 4, 5, 6, 7, 8, 9, 10, 11, 12, 13, 14, 15, 16, 17, 18, 19, or wt %. Further, according to some embodiments of the present invention, the amount of the acrylic-based photopolymerizable monomer can be in a range from about any of the foregoing amounts to about any other of the foregoing amounts.

When the acrylic-based photopolymerizable monomer is included in an amount within the above range, a pattern may have a neat edge and good developing property in an alkali developing solution.

(C) Photopolymerization Initiator

Examples of the photopolymerization initiator may include without limitation triazine-based compounds, acetophenone-based compounds, biimidazole-based compounds, benzoin-based compounds, benzophenone-based compounds, thioxanthone-based compounds, oxime-based compounds, and the like, and combinations thereof.

Examples of the triazine-based compound may include without limitation 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-(4-methoxystyryl)-1,3,5-triazine, 2,4-bis(trichloromethyl)-6-[2-(5-methylfuran-2-yl)ethenyl]-1,3,5-triazine, 2,4-bis(trichloromethyl)-6-[2-(furan-2-yl)ethenyl]-1,3,5-triazine, 2,4-bis(trichloromethyl)-6-[2-(4-diethylamino-2-methylphenyl)ethenyl]-1,3,5-triazine, 2,4-bis(trichloromethyl)-6-[2-(3,4-dimethoxyphenyl)ethenyl]-1,3,5-triazine, 2,4-bis(trichloromethyl)-6-piperonyl)-1,3,5-triazine, 2,4,6-trichloro-s-triazine, 2-phenyl-4,6-bis(trichloro methyl)-s-triazine, 2-(3',4'-dimethoxy styryl)-4,6-bis(trichloro methyl)-s-triazine, 2-(4'-methoxy naphthyl)-4,6-bis(trichloro methyl)-s-triazine, 2-(p-methoxy phenyl)-4,6-bis(trichloro methyl)-s-triazine, 2-(p-tolyl)-4,6-bis(trichloro methyl)-s-triazine, 2-biphenyl-4,6-bis(trichloro methyl)-s-triazine, bis(trichloro methyl)-6-styryl-s-triazine, 2-(naphto-1-yl)-4,6-bis(trichloro methyl)-s-triazine, 2-(4-methoxy naphto-1-yl)-4,6-bis(trichloro methyl)-s-triazine, 2-4-trichloro methyl (piperonyl)-6-triazine, 2-4-trichloro methyl (4'-methoxy styryl)-6-triazine and the like, and combinations thereof. In one embodiment, 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-(4-methoxystyryl)-1,3,5-triazine and/or 2,4-bis(trichloromethyl)-6-piperonyl-1,3,5-triazine, may be used, and in another embodiment, 2,4-bis(trichloromethyl)-6-piperonyl-1,3,5-triazine may be used.

Examples of the acetophenone-based compound may include without limitation diethoxyacetophenone, 2-methyl-2-morpholino-1-(4-methylthiophenyl)propan-1-one, 2-hydroxy-2-methyl-1-phenylpropan-1-one, benzyldimethylketal, 2-hydroxy-2-methyl-1-[4-(2-hydroxyethoxy)phenyl]propan-1-one, 1-hydroxycyclohexylphenylketone, 2-benzyl-2-dimethylamino-1-(4-morpholinophenyl)butan-1-one, 2-(4-methylbenzyl)-2-dimethylamino-1-(4-morpholinophenyl)butan-1-one, 2-hydroxy-2-methyl-1-[4-(1-methylvinyl)phenyl]propan-1-one, and the like, and combinations thereof. In one embodiment, 2-methyl-2-morpholino-1-(4-methylthiophenyl)propan-1-one, 2-benzyl-2-dimethylamino-1-(4-morpholinophenyl)butan-1-one and/or 2-(4-methylbenzyl)-2-dimethyl amino-1-(4-morpholinophenyl) butan-1-one, for example, 2-benzyl-2-dimethylamino-1-(4-morpholinophenyl)butan-1-one and/or 2-(4-methylbenzyl)-2-dimethylamino-1-(4-morpholinophenyl)butan-1-one may be used.

Examples of the biimidazole-based compound may include without limitation 2,2'-bis(2-chlorophenyl)-4,4',5,5'-tetraphenylbiimidazole, 2,2'-bis (2-chlorophenyl)-4,4',5,5'-tetra(4-carboethoxyphenyl)biimidazole, 2,2',-bis (2-chlorophenyl)-4,4',5,5'-tetra(4-bromophenyl)biimidazole, 2,2'-bis (2-chlorophenyl)-4,4',5,5'-tetra(2,4-dichlorophenyl) biimidazole, 2,2'-bis (2-bromophenyl)-4,4',5,5'-tetraphenylbiimidazole, 2,2'-bis (2,4-dichlorophenyl)-4,4',5,5'-tetraphenylbiimidazole, 2,2'-bis (2-chlorophenyl)-4,4',5,5'-tetra(m-methoxyphenyl)biimidazole, 2,2'-bis (2,3-dichlorophenyl)-4,4',5,5'-tetraphenylbiimidazole, 2,2'-bis (2,6-dichlorophenyl)-4,4',5,5'-tetraphenylbiimidazole, 2,2'-bis (2-nitrophenyl)-4,4',5,5'-tetraphenylbiimidazole, 2,2'-bis (2-methylphenyl)-4,4',5,5'-tetraphenylbiimidazole, and the like, and combinations thereof. In one embodiment, 2,2'-bis (2-chlorophenyl)-4,4',5,5'-tetraphenylbiimidazole and/or 2,2'-bis (2,3-dichlorophenyl)-4,4',5,5'-tetraphenylbiimidazole may be used.

Examples of the benzoin-based compound may include without limitation benzoin, benzoin methylether, benzoin ethylether, benzoin isopropylether, benzoin isobutylether, benzyldimethylketal, and the like, and combinations thereof.

Examples of the benzophenone-based compound may include without limitation benzophenone, benzoyl benzoate, o-benzoyl methyl benzoate, 4-phenyl benzophenone, hydroxy benzophenone, acrylated benzophenone, 3,3'-dimethyl-2-methoxy benzophenone, 4,4'-dichloro benzophenone, 4,4'-bis(dimethylamino)benzophenone, 4,4'-bis(diethylamino)benzophenone, 4-benzoyl-4'-methyldiphenylsulfide, 3,3',4,4'-tetra(tert-butylperoxycarbonyl)benzophenone, 2,4,6-trimethylbenzophenone, and the like, and combinations thereof.

Examples of the thioxanthone-based compound may include without limitation thioxanthone, 2-methyl thioxanthone, 2-isopropyl thioxanthone, 4-isopropyl thioxanthone, 2,4-diethyl thioxanthone, 2,4-diisopropyl thioxanthone, 2-chloro thioxanthone, 1-chloro-4-propoxythioxanone, and the like, and combinations thereof.

Examples of the oxime-based compound may include without limitation o-acyloxime-based compounds, 2-(o-benzoyloxime)-1-[4-(phenylthio)phenyl]-1,2-octadione, 1-(o-acetyloxime)-1-[9-ethyl-6-(2-methylbenzoyl)-9H-carbazol-3-yl]ethanone, o-ethoxycarbonyl-α-oxyamino-1-phenylpropan-1-one, and the like, and combinations thereof. Examples of the o-acyloxime-based compound include without limitation 1-(4-phenylsulfanylphenyl)-butan-1,2-dione 2-oxime-o-benzoate, 1-(4-phenylsulfanylphenyl)-octane-1,2-dione 2-oxime-o-benzoate, 1-(4-phenylsulfanylphenyl)-octan-1-oneoxime-o-acetate, 1-(4-phenylsulfanylphenyl)-butan-1-oneoxime-o-acetate, and the like, and combinations thereof.

Examples of the photopolymerization initiator may further include one or more selected from carbazole based compounds, diketone based compounds, sulfonium borate based compounds, diazo based compounds, and the like, and combinations thereof.

The photopolymerization initiator absorbs light and is excited and then transmits energy, and it may be used with a photo-sensitizer causing a chemical reaction.

The photosensitive resin composition may include the photopolymerization initiator in an amount of about 0.1 to about 10 wt % based on the total amount (weight) of the photosensitive resin composition for a color filter. In some embodiments, the photosensitive resin composition may include the photopolymerization initiator in an amount of about 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the photopolymerization initiator can be in a range from about any of the foregoing amounts to about any other of the foregoing amounts.

When the photopolymerization initiator is included in an amount within the above range, it may bring about sufficient photopolymerization in the patterning process, and may provide minimal or no transmittance deterioration due to residual non-reacting initiator remnants.

The degree of cross-linking caused by the acrylic-based copolymer (A) can be determined based on the composition ratio of the acrylic-based photopolymerizable monomer (B) and the photopolymerization initiator (C), and accordingly the degree of cross-linking may be controlled by adjusting the composition ratio of the acrylic-based photopolymerizable monomer (B) and the photopolymerization initiator (C). For example, the acrylic-based photopolymerizable monomer (B) and photopolymerization initiator (C) may be in the range of about 1:0.0005 to about 1:20.

(D) Colorant

Examples of the colorant may include without limitation organic pigments, inorganic pigments, dyes, and the like, and combinations thereof. The pigment and/or dye may be a compound having a color such as red, green, blue, yellow, violet, and the like.

Examples of the dye may include without limitation anthraquinone-based compounds, cyanine-based compounds, merocyanine-based compounds, azaporphyrin-based compounds, phthalocyanine-based compounds, pyrrolopyrrole-based compounds, diazo-based compounds, carbonium-based compounds, acridine-based compounds, thiazole-based compounds, quinidine-based compounds, methine-based compounds, quinoline-based compounds, and the like, and combinations thereof.

Examples of the organic pigment may include without limitation condensed polycyclic pigments such as anthraquinone-based pigments, perylene-based pigments, and the like, phthalocyanine-based pigments, azo-based pigments, aniline-based pigments, and the like. The organic pigments can be used singularly or as a mixture of two or more. Two or more pigments may be combined for adjusting maximum absorption wavelength, cross point, crosstalk, and the like.

Examples of the inorganic pigment may include without limitation carbon black, titanium oxide, zirconium oxide, silver halide, titanium (TiOx) black, and the like. The inorganic pigments can be used singularly as a mixture of two or more.

The colorant may be dispersed in a solvent to be prepared in form of dispersion and be included in the photosensitive resin composition for a color filter.

In order to disperse the colorant in the dispersion uniformly, a dispersing agent may be used as needed. For this purpose, a non-ionic, anionic, or cationic dispersing agent may be used, for example polyalkyleneglycol and esters thereof, polyoxyalkylene, a polyhydric alcohol ester alkylene oxide addition product, an alcoholalkyleneoxide addition product, sulfonic acid ester, sulfonates, carboxylic acid ester, carboxylates, an alkylamidealkyleneoxide addition product, an alkylamine, and the like. These dispersing agents may be used singularly or as a mixture of two or more.

Along with the dispersing agent, a carboxyl group-containing first acrylic-based copolymer may be added to the dispersion to improve stability of the dispersion and pattern formation of pixels.

The photosensitive resin composition may include the colorant in an amount of about 0.1 to about 40 wt % based on the total amount (weight) of the photosensitive resin composition for a color filter. In some embodiments, the photosensitive resin composition may include the colorant in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the colorant can be in a range from about any of the foregoing amounts to about any other of the foregoing amounts.

When the photosensitive resin composition includes the colorant in an amount within the above range, coloring effects and development performance may be desirable.

(E) Solvent

The solvent is compatible with the acrylic-based copolymer (A) and other component materials but does react therewith.

Examples of the solvent may include without limitation alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactic acid esters such as methyl lactate, ethyl lactate, and the like; oxy alkyl acetate esters such as oxy methyl acetate, oxy ethyl acetate, oxy butyl acetate, and the like; alkoxy alkyl acetate esters such as methoxy methyl acetate, methoxy ethyl acetate, methoxy butyl acetate, ethoxy methyl acetate, ethoxy ethyl acetate, and the like; 3-oxy alkyl propionate esters such as 3-oxy methyl propionate, 3-oxy ethyl propionate, and the like; 3-alkoxy alkyl propionate esters such as 3-methoxy methyl propionate, 3-methoxy ethyl propionate, 3-ethoxy ethyl propionate, 3-ethoxy methyl propionate, and the like; 2-oxy alkyl propionate esters such as 2-oxy methyl propionate, 2-oxy ethyl propionate, 2-oxy propyl propionate, and the like; 2-alkoxy alkyl propionate esters such as 2-methoxy methyl propionate, 2-methoxy ethyl propionate, 2-ethoxy ethyl propionate, 2-ethoxy methyl propionate, and the like; 2-oxy-2-methyl propionate esters such as 2-oxy-2-methyl methyl propionate, 2-oxy-2-methyl ethyl propionate, and the like; 2-alkoxy-2-methyl alkyl propionates of monooxy monocarboxylic acid alkyl esters such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-hydroxy-3-methyl methyl butanote, and the like; ketone acid esters such as ethyl pyruvate, and the like; a solvent having a high boiling point such as N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, carbonate ethylene, carbonate propylene, phenyl cellosolve acetate, and the like; and combinations thereof.

In one embodiment, taking into account compatibility and reactivity, glycol ethers such as ethylene glycol monoethyl ether, and the like; ethylene glycol alkylether acetates such as ethyl cellosolve acetate, and the like; esters such as 2-hydroxy ethyl propionate, and the like; diethylene glycols such as diethylene glycol monomethyl ether, and the like; propylene glycol alkylether acetates such as propylene glycol methylether acetate, propylene glycol propylether acetate, and the like, and combinations thereof, may be used. Taking into account solubility of a dye, cyclohexanone may be used in an amount of about 10 to about 80 parts by weight based on about 100 parts by weight of a solvent. These solvents may be used singularly or as a mixture of two or more.

The photosensitive resin composition may include the solvent in a balance amount, for example about 20 to about 90 wt %, based on the total weight of the photosensitive resin composition. In some embodiments, the photosensitive resin composition may include the solvent in an amount of about 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the solvent can be in a range from about any of the foregoing amounts to about any other of the foregoing amounts.

When the solvent is present in an amount within the above range, the photosensitive resin composition can have good coating properties and can maintain flatness at a thickness of greater than or equal to 1 μm.

(F) Other Additive(s)

The photosensitive resin composition for a color filter may further include the dispersing agent described above in order to disperse the colorant (D) component in a solvent (E), along with the (A) to (E) components.

Examples of the dispersing agent may include without limitation polyalkyleneglycols and esters thereof, polyoxyalkylenes, polyhydric alcohol ester alkylene oxide addition products, alcoholalkyleneoxide addition products, sulfonic acid esters, sulfonate salts, carboxylic acid esters, carboxylate salts, alkylamidealkyleneoxide addition products, alkylamines, and the like. These may be used singuraly or as a combination of two or more.

The dispersing agent may be included in an amount of about 10 to about 20 parts by weight based on about 100 parts by weight of the colorant.

Also, the photosensitive resin composition may further include a silicon-based and/or fluorine-based coating improving agent to improve the coating property and foam removing property. The photosensitive resin composition may further include an adherence improving agent to improve adherence to a substrate.

The photosensitive resin composition may include the coating improving agent and/or the adherence improving agent in an amount of about 0.01 to about 1 wt % based on the total amount (weight) of the photosensitive resin composition.

In addition, the photosensitive resin composition may further include one or more additional additives. Examples of additives include without limitation epoxy compounds; malonic acid; 3-amino-1,2-propanediol; silane-based coupling agents with a vinyl group or a (meth)acryloxy group; leveling agents; silicon-based surfactants; fluorine-based surfactants; radical polymerization initiators, and the like, and combinations thereof with one another and/or with the other additivices disclosed herein. The additives may prevent or minimize staining or spotting during the coating, may prevent or minimize generation of a residue due to non-development, and/or control leveling. These amounts of the additives may be easily adjusted depending on a desired property and can be readily determined by the skilled artisan without undue experimentation.

Examples of the epoxy compound may include without limitation phenol novolac epoxy resins, tetra methyl nonphenyl epoxy resins, bisphenol A-type epoxy resins, alicyclic epoxy resins, ortho-cresol novolac resins, and the like, and combinations thereof. The photosensitive resin composition may include the epoxy compound in an amount of about 0.01 to about 10 wt % based the total amount (weight) of the photosensitive resin composition. When the epoxy compound is included in an amount within the above range, it may provide excellent storage and process margin.

Examples of the silane-based coupling agent may include without limitation vinyl trimethoxysilane, vinyl tris(2-methoxyethoxysilane), 3-glycidoxypropyl trimethoxysilane, 2-(3, 4-epoxy cyclohexyl)ethyl trimethoxysilane, 3-chloropropyl methyldimethoxysilane, 3-chloropropyl trimethoxysilane, 3-methacryloxylpropyl trimethoxysilane, 3-mercaptopropyl trimethoxysilane, and the like, and combinations thereof.

Examples of the silicon-based surfactant may include without limitation surfactants including a siloxane bond, and the like, and combinations thereof. Examples of the silicon-based surfactant may include without limitation DC3PA, SH7PA, DC11PA, SH21PA, SH28PA, 29SHPA, and SH30PA of TORAY SILICONE CO., LTD.; polyester-modified silicone oils, SH8400 of TORAY SILICONE CO., LTD; KP321, KP322, KP323, KP324, KP326, KP340, and GF of SHI-NETSU SILICONE CO., LTD.; TSF4445, TSF4446, TSF4452, and TSF4460 of TOSHIBA SILICONE CO., LTD.; and the like, and combinations thereof.

Examples of the fluorine-based surfactant may include without limitation surfactants having a fluorocarbon backbone, and the like, and combinations thereof. Examples of the fluorine-based surfactant may include without limitation FULORAD FC430, and FULORAD FC431 of SUMITOMO 3M CO., LTD.; MEGAFACE F142D, MEGAFACE F171, MEGAFACE F172, MEGAFACE F173, MEGAFACE F177, MEGAFACE F183, MEGAFACE F470, MEGAFACE F475, MEGAFACE R30 of DAINIPPON INK KAGAKU KOGYO CO., LTD.; EFTOP EF301, EFTOP EF303, EFTOP EF351, and EFTOP EF352 of TOCHEM RODUCTS, CO., LTD.; SURFLON S381, SURFLON S382, SURFLON SC101, and SURFLON SC105 of ASAHI GLASS CO., LTD.; E5844 of DIKIN Finechemical Laboratory; and the like, and combinations thereof.

The silicon-based surfactant and fluorine-based surfactant may be used singularly or as a mixture of two or more.

According to another embodiment, a color filter manufactured using the photosensitive resin composition is provided.

The photosensitive resin composition for a color filter may be coated to a thickness of about 3.1 to about 3.4 μm on a bare glass substrate and a glass substrate coated with 500 to 1500 Å-thick SiNx (a protective layer) using any appropriate method such as spinning, slit coating, and the like. The coated substrate can be exposed to radiation to form a pattern required for a color filter. After the radiation, the coated layer can be treated with an alkali developing solution to dissolve the unradiated (non-exposed) part and form a pattern for a color filter. These processes can be repeated as many times as necessary depending on the numbers of colors such as red, green, blue, black, and the like required to form a color filter with a desired pattern. In addition, this image pattern may be cured by heating or exposing to radiation to further improve crack resistance, solvent resistance, and the like.

In general, since a negative photosensitive resin is not easily stripped by an organic solvent, its residue may contaminate a lower layer. In addition, since the negative photosensitive resin is more weakly adhered to a lower layer than a positive photosensitive resin, it may have a larger under-cut. However, a photosensitive resin composition for a color filter according to the present invention may improve resistance of such a negative photosensitive resin to a stripper and thus can prevent contamination of a lower layer and also can improve adherence to the lower layer.

The following examples illustrate the present invention in more detail. However, it is understood that the present invention is not limited by these examples.

Synthesis Examples 1-5

Preparation of Base Polymer for Synthesizing Chemical Formula 1

8 wt % total of 2,2'-azobis(2,4-dimethylvalero nitrile) (initiator) monomer and monomers in the weight ratios shown in Table 1 are introduced into in a flask having a condenser and an agitator. 200 parts by weight propyleneglycol monomethyletheracetate (PGMEA, solvent) based on a total of 100 parts by weight of the initiator and the monomer is added thereto, and then the reaction solution is slowly agitated under a nitrogen atmosphere. The reaction solution is heated to 80° C. and agitated for 8 hours, and an acrylic-based copolymer containing aliphatic hydrocarbon is polymerized. The obtained acrylic-based copolymer solution has a solid concentration of 34 wt %.

TABLE 1

|  | Synthesis Example 1 | Synthesis Example 2 | Synthesis Example 3 | Synthesis Example 4 | Synthesis Example 5 |
|---|---|---|---|---|---|
| Methacrylic acid | 25 | 25 | 25 | 20 | 15 |
| Tricycledecanylmetacrylate | 50 | — | — | 50 | 50 |
| Mono-2-acryloylethylsuccinate | — | — | — | 10 | 20 |
| Tetrahydrofurylmethacrylate | 25 | 25 | 25 | 20 | 15 |
| N-benzylmaleimide | — | 50 | — | — | — |
| Benzyl methacrylate | — | — | 50 | — | — |
| Weight average molecular weight (Mw) | 13,000 | 13,000 | 13,500 | 13,000 | 13,400 |

Synthesis Examples 6-10

Copolymerization Reaction of Copolymers Synthesized from Synthesis Examples 1-5 and Glycidylmethacrylate 100 parts by weight of each copolymer synthesized from Synthesis Examples 1-5 is introduced into a flask having a condenser and an agitator and 10 parts by weight of glycidylmethacrylate (Japan NNOF Corporation) is added thereto and slowly agitated under a nitrogen atmosphere. The reaction solution is prepared by heating to 100° C. and agitating for 18 hours. The following Table 2 shows the types and amounts of reactants in parts by weight.

TABLE 2

|  | Synthesis Example 6 | Synthesis Example 7 | Synthesis Example 8 | Synthesis Example 9 | Synthesis Example 10 |
|---|---|---|---|---|---|
| Glycidylmethacrylate | 4 | 4 | 4 | 4 | 4 |
| Polymer of Synthesis Example 1 | 100 | — | — | — | — |
| Polymer of Synthesis Example 2 | — | 100 | — | — | — |
| Polymer of Synthesis Example 3 | — | — | 100 | — | — |
| Polymer of Synthesis Example 4 | — | — | — | 100 | — |
| Polymer of Synthesis Example 5 | — | — | — | — | 100 |

Synthesis Examples 11-15

Copolymerization Reaction of Copolymers Synthesized from Synthesis Examples 1-5 and 2-isocyanatomethacrylate 100 parts by weight of each copolymer synthesized from Synthesis Examples 6-10 is introduced into a flask having a condenser and an agitator and 10 parts by weight of 2-isocyanatomethacrylate (Showa Denko) is added thereto and slowly agitated under a nitrogen atmosphere. The reaction solution is prepared by heating to 50° C. and agitating 12 hours. The following Table 3 shows the types and amount of reactants in parts by weight.

TABLE 3

|  | Synthesis Example 11 | Synthesis Example 12 | Synthesis Example 13 | Synthesis Example 14 | Synthesis Example 15 |
|---|---|---|---|---|---|
| 2-isocyanatomethacrylate | 3 | 3 | 3 | 3 | 3 |
| Polymer of Synthesis Example 6 | 100 | — | — | — | — |
| Polymer of Synthesis Example 7 | — | 100 | — | — | — |
| Polymer of Synthesis Example 8 | — | — | 100 | — | — |
| Polymer of Synthesis Example 9 | — | — | — | 100 | — |
| Polymer of Synthesis Example 10 | — | — | — | — | 100 |

Preparation of Photosensitive Resin Composition for Color Filter

Examples 1-5

A photosensitive resin composition is prepared using the following components. First, a photopolymerization initiator is dissolved into a solvent and agitated for 2 hours at room temperature. Then each acrylic-based copolymer synthesized from Synthesis Examples 11 to 15 and an acrylic-based photopolymerizable monomer are added and agitated for 2 hours at room temperature. A pigment dispersion is added thereto and agitated for 1 hour at room temperature to provide a photosensitive resin composition for a color filter according to the present invention. The solution is filtered three times to remove impurities.

TABLE 4

| Composition | Weight [%] |
|---|---|
| (A) acrylic-based copolymer (polymerized copolymer prepared in Synthesis Examples 11 to 15) | 6.4 |
| (B) acrylic-based photopolymerizable monomer | |
| dipentaerythritol hexaacrylate (DPHA) | 4.4 |
| (C) photopolymerization initiator | |
| IGACURE OXE02 (Ciba Specialty Chemicals) | 0.2 |
| (D) pigment dispersion | 50.7 |
| TDB-1 (DNS, blue pigment) | 9.4 |
| RL-01(Clariant, purple pigment) | 0.8 |
| BYK 6919(BYK, dispersing agent) | 2.5 |
| acrylic-based copolymer (A) | 5.8 |
| PGMEA (solvent) | 32.2 |
| (E) Solvent | |
| PGMEA | 25.9 |
| ethylethoxy propionate | 12.3 |
| (F) Additive | |
| F-475 (DIC, fluorine-based surfactant) | 0.1 |

Comparative Examples 1 to 5

A photosensitive resin composition for a color filter is prepared in accordance with the same procedure as in Examples 1 to 5, except using the acrylic-based copolymers synthesized from Synthesis Examples 1, 2, 5, 6 and 10 as an acrylic-based copolymer (A) as shown in the following Table 5.

TABLE 5

| | Ex. 1 | Ex. 2 | Ex. 3 | Ex. 4 | Ex. 5 | Comp. Ex. 1 | Comp. Ex. 2 | Comp. Ex. 3 | Comp. Ex. 4 | Comp. Ex. 5 |
|---|---|---|---|---|---|---|---|---|---|---|
| Polymer of Synthesis Example 1 | ○ | — | — | — | — | — | — | — | — | — |
| Polymer of Synthesis Example 12 | — | ○ | — | — | — | — | — | — | — | — |
| Polymer of Synthesis Example 13 | — | — | ○ | — | — | — | — | — | — | — |
| Polymer of Synthesis Example 14 | — | — | — | ○ | — | — | — | — | — | — |
| Polymer of Synthesis Example 15 | — | — | — | — | ○ | — | — | — | — | — |
| Polymer of Synthesis Example 1 | — | — | — | — | — | ○ | — | — | — | — |
| Polymer of Synthesis Example 2 | — | — | — | — | — | — | ○ | — | — | — |
| Polymer of Synthesis Example 5 | — | — | — | — | — | — | — | ○ | — | — |
| Polymer of Synthesis Example 6 | — | — | — | — | — | — | — | — | ○ | — |
| Polymer of Synthesis Example 10 | — | — | — | — | — | — | — | — | — | ○ |

Evaluation of Sensitivity

Using each photosensitive resin composition prepared from Examples 1 to 5 and Comparative Examples 1 to 5, sensitivity is evaluated as follows:

Using a spin-coater (K-Spin8 manufactured by KDNS), each photosensitive resin composition obtained from Examples 1 to 5 and Comparative Examples 1 to 5 is coated to a thickness of 3 μm on a transparent circular bare glass substrate and a glass substrate coated with silicon nitride (SiNx) in a thickness of 500 Å. The coated substrate is soft-baked at 80° C. for 150 seconds using a hot-plate and exposed using a power of 60 mJ using a exposurer (I10C manufactured by Nikon) and developed using a developer at room temperature (25° C.) for 60 seconds and washed for 60 seconds and spin-dried for 25 seconds. The developing solution is a potassium hydroxide aqueous solution having a concentration of 1 wt %. Then the coated substrate is hard-baked in an oven at 230° C. for 30 minutes to provide a pattern using a 10 μm mask, and then the obtained pattern is measured for the area using an optical microscope. The results are shown in the following Table 6.

TABLE 6

| | Ex. 1 | Ex. 2 | Ex. 3 | Ex. 4 | Ex. 5 | Comp. Ex. 1 | Comp. Ex. 2 | Comp. Ex. 3 | Comp. Ex. 4 | Comp. Ex. 5 |
|---|---|---|---|---|---|---|---|---|---|---|
| Width of pattern (μm) | 12.2 | 11.9 | 11.8 | 12.1 | 12 | 8.7 | 8.8 | 8.6 | 10.1 | 10.5 |

As shown in Table 6, Examples 1 to 5 had a higher bias than Comparative Examples 1 to 5. Accordingly, it is confirmed that Examples 1 to 5 have a higher sensitivity than Comparative Examples 1 to 5.

Evaluation of Heat Resistance

Using each photosensitive resin composition prepared from Examples 1 to 5 and Comparative Examples 1 to 5, heat resistance is evaluated as follows:

Using a spin-coater (K-Spin8 manufactured by KDNS), each photosensitive resin composition obtained from Examples 1 to 5 and Comparative Examples 1 to 5 is coated to a thickness of 3 μm on a transparent circular bare glass substrate and a glass substrate coated with silicon nitride (SiNx) in a thickness of 500 Å. The coated substrate is soft-baked using a hot-plate at 80° C. for 150 seconds and exposed using a power of 60 mJ using a exposurer (I10C manufactured by Nikon) and developed using a developer at room temperature (25° C.) for 60 seconds and washed for 60 seconds and spin dried for 25 seconds. The developing solution is a potassium hydroxide aqueous solution having a concentration of 1 wt %. Then the coated substrate is hard-baked in an oven at 230° C. for 30 minutes and measured for color, and then baked in an oven at 230° C. for 2 hours. The color change is measured using a colorimeter (spectrophotometer, MCPD3000 measured by Otsuka Electronics), and the results are shown in the following Table 6. The heat resistance is evaluated according to the difference (ΔE) of color change before and after the heat treatment as follows:

<Heat Resistance Reference>

When a color change (ΔE) is less than 3 after the heat treatment is carried out in an oven at about 230° C.: Excellent When a color change (ΔE) is greater than or equal to 3 and less than 5 after the heat treatment is carried out in an oven at about 230° C.: Insufficient When a color change (ΔE) is greater than or equal to 5 after the heat treatment is carried out in an oven at about 230° C.: Bad

TABLE 7

| | Color changes | | Peeling | | heat resistance | |
|---|---|---|---|---|---|---|
| | Bare glass | SiNx | Bare glass | SiNx | Bare glass | SiNx |
| Example 1 | Excellent | Excellent | Excellent | Excellent | Excellent | Excellent |
| Example 2 | Excellent | Excellent | Insufficient | Excellent | Excellent | Excellent |
| Example 3 | Excellent | Excellent | Excellent | Excellent | Excellent | Excellent |
| Example 4 | Excellent | Insufficient | Excellent | Excellent | Excellent | Excellent |
| Example 5 | Excellent | Excellent | Excellent | Insufficient | Excellent | Excellent |
| Comparative Example 1 | Bad | Bad | Bad | Bad | Insufficient | Insufficient |
| Comparative Example 2 | Bad | Bad | Bad | Bad | Bad | Bad |
| Comparative Example 3 | Bad | Bad | Bad | Bad | Bad | Bad |
| Comparative Example 4 | Insufficient | Bad | Insufficient | Insufficient | Bad | Bad |
| Comparative Example 5 | Insufficient | Insufficient | Bad | Insufficient | Insufficient | Insufficient |

Referring to Tables 6 and 7, it is confirmed that the patterns of photosensitive resins obtained from Examples 1 to 5 according to present invention have excellent sensitivity and also have excellent heat resistance when compared for the pattern area formed using the same material except for the polymer and using the same exposure.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

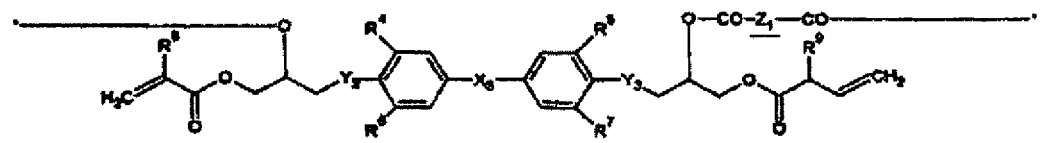

What is claimed is:

1. A photosensitive resin composition for a color filter, comprising:
   (A) an acrylic-based copolymer including a structural unit represented by the following Chemical Formula 1;
   (B) an acrylic-based photopolymerizable monomer;
   (C) a photopolymerization initiator;

(D) a colorant; and
(E) a solvent:

[Chemical Formula 1]

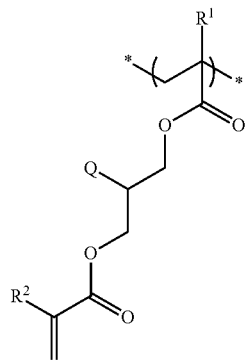

wherein, in Chemical Formula 1, $R^1$ and $R^2$ are the same or different and are each independently hydrogen or substituted or unsubstituted C1 to C30 alkyl, and Q is represented by the following Chemical Formula 2,

[Chemical Formula 2]

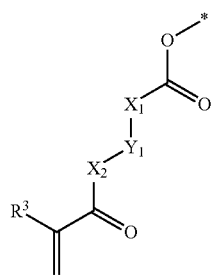

wherein, in Chemical Formula 2, $R^3$ is hydrogen or substituted or unsubstituted C1 to C30 alkyl, $Y_1$ is C1 to C30 alkylene, $X_1$ and $X_2$ are the same or different and are each independently —O—, —N(H)—, or —S—.

2. The photosensitive resin composition for a color filter of claim 1, wherein the photosensitive resin composition for a color filter comprises
(A) about 1 wt % to about 50 wt % of the acrylic-based copolymer including the structural unit represented by the above Chemical Formula 1;
(B) about 0.5 wt % to about 20 wt % of the acrylic-based photopolymerizable monomer;
(C) about 0.1 to about 10 wt % of the photopolymerization initiator;
(D) about 0.1 wt % to about 40 wt % of the colorant; and
(E) balance of the solvent.

3. The photosensitive resin composition for a color filter of claim 1, wherein the acrylic-based copolymer (A) including the structural unit represented by the above Chemical Formula 1 has a weight average molecular weight (Mw) of about 3,000 to about 500,000.

4. The photosensitive resin composition for a color filter of claim 1, wherein the acrylic-based copolymer (A) including the structural unit represented by the above Chemical Formula 1 has an acid value of about 20 to about 200 mgKOH/g.

5. The photosensitive resin composition for a color filter of claim 1, wherein the photosensitive resin composition for a color filter further comprises a dispersing agent, an epoxy compound, malonic acid, 3-amino-1,2-propanediol, a silane-based coupling agent including a vinyl group or a (meth) acryloxy group, a leveling agent, a silicon-based surfactant, a fluorine-based surfactant, a radical polymerization initiator, or a mixture thereof.

6. The photosensitive resin composition for a color filter of claim 1, wherein the photosensitive resin composition for a color filter further comprises a cardo-based polymer including a structural unit represented by the following Chemical Formula 3, along with the acrylic-based copolymer (A);

-[A]$_m$-[B]$_n$—    [Chemical Formula 3]

wherein, in Chemical Formula 3, m and n are the same or different and are each independently an integer ranging from 1 to 100,
A is represented by the following Chemical Formula 4, and
B is represented by the following Chemical Formula 5,

[Chemical Formula 4]

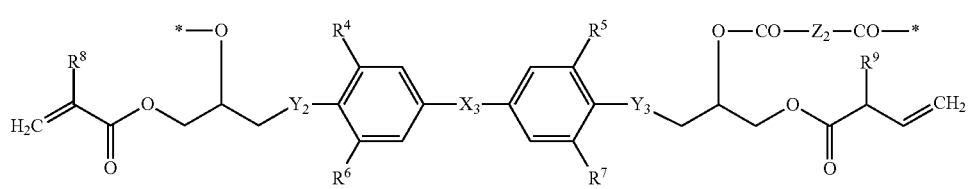

wherein, in Chemical Formula 4, $R^4$ to $R^7$ are the same or different and are each independently hydrogen, C1 to C30 alkyl, or halogen, and $R^8$ and $R^9$ are the same or different and are each independently hydrogen or methyl,
$X_3$ is

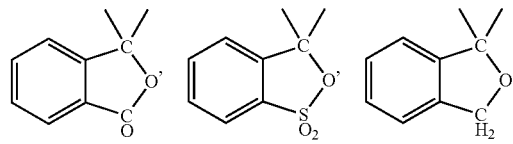

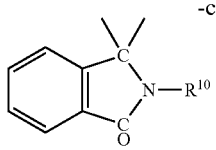

(wherein, $R^{10}$ is hydrogen, ethyl, —$C_2H_4Cl$, —$C_2H_4OH$, —$CH_2CH$=$CH_2$, or -Phenyl),

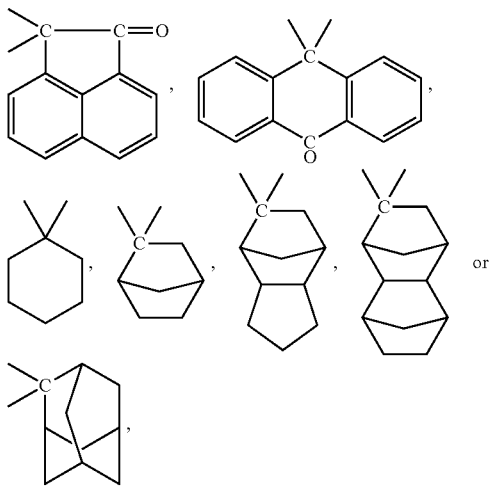

$Y_2$ and $Y_3$ are the same or different and are each independently —O—, —$NR^{11}$— (wherein $R^{11}$ is hydrogen, methyl, ethyl, —$CH_2OH$, —$C_2H_4OH$, or —$CH_2CH$=$CH_2$), or —C(=O)O—, and $Z_1$ is an acid monoanhydride derivative or an acid dianhydride derivative,

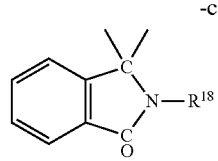

(wherein $R^{18}$ is hydrogen, an ethyl group, —$C_2H_4Cl$, $C_2H_4OH$, —$CH_2CH$=$CH_2$, or -Phenyl),

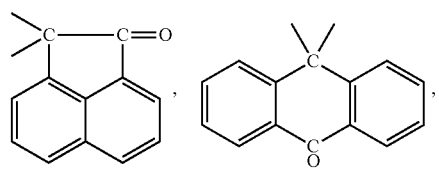

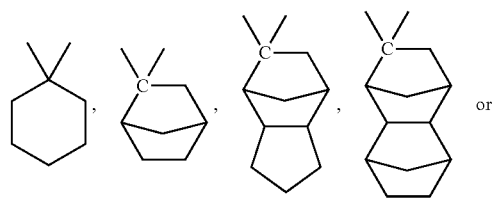

[Chemical Formula 5]

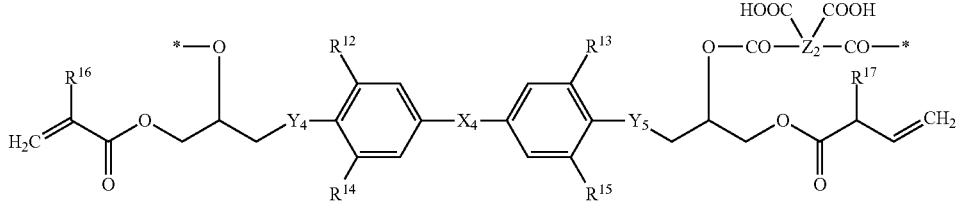

wherein, in Chemical Formula 5, $R^{12}$ to $R^{15}$ are the same or different and are each independently hydrogen, C1 to C30 alkyl, or halogen, $R^{16}$ and $R^{17}$ are the same or different and are each independently hydrogen or methyl, $X_4$ is

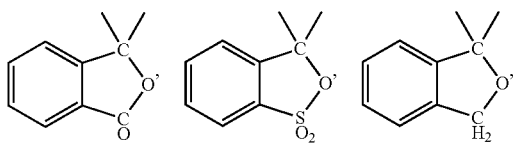

-continued

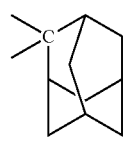

$Y_4$ and $Y_5$ are the same or different and are each independently —O—, —$NR^{19}$— (wherein $R^{19}$ is hydrogen, methyl, ethyl, —$CH_2OH$, —$C_2H_4OH$, or —$CH_2CH$=$CH_2$), or —C(=O)O—, and $Z_2$ is an acid monoanhydride derivative or an acid dianhydride derivative.

7. The photosensitive resin composition for a color filter of claim 6, wherein the cardo-based polymer has a weight average molecular weight (Mw) of about 500 to about 30,000.

8. The photosensitive resin composition for a color filter of claim 6, comprising the cardo-based polymer in an amount of about 1 wt % to about 50 wt % based on the total weight of the photosensitive resin composition for a color filter.

9. A color filter manufactured using the photosensitive resin composition for a color filter according to claim 1.

* * * * *

UNITED STATES PATENT AND TRADEMARK OFFICE
CERTIFICATE OF CORRECTION

PATENT NO. : 8,822,110 B2  
APPLICATION NO. : 13/589529  
DATED : September 2, 2014  
INVENTOR(S) : Chang-Min Lee et al.

Page 1 of 2

It is certified that error appears in the above-identified patent and that said Letters Patent is hereby corrected as shown below:

In the Specification

Column 3, Lines 56-67 Chemical Formula 4 is depicted as:

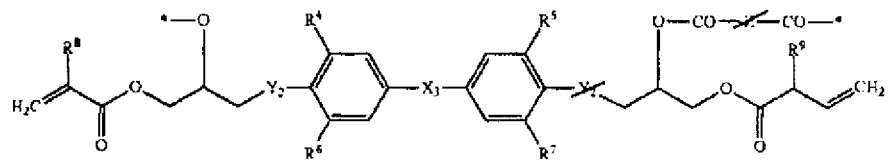

and should be depicted as:

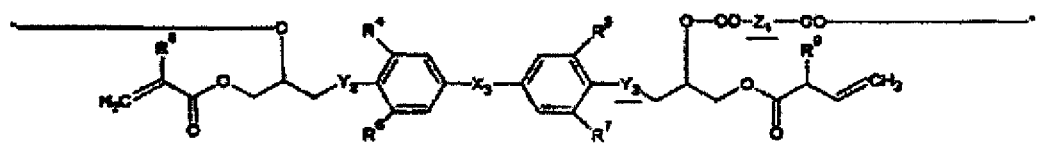

Columns 11 and 12, Lines 1-10 Chemical Formula 4 is depicted as:

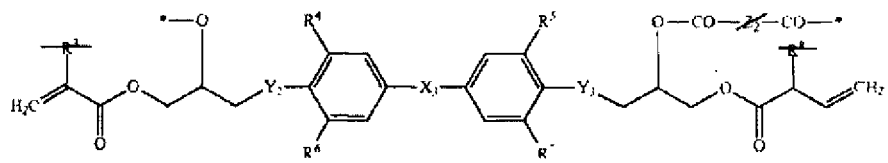

and should be depicted as:

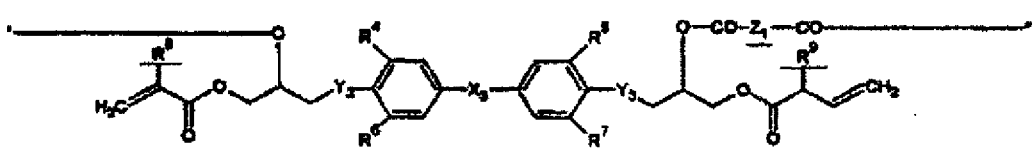

Signed and Sealed this  
Thirteenth Day of January, 2015

Michelle K. Lee  
*Deputy Director of the United States Patent and Trademark Office*

CERTIFICATE OF CORRECTION (continued)
U.S. Pat. No. 8,822,110 B2

In the Claims

Claim 6, Columns 27 and 28 Chemical Formula 4 is depicted as:

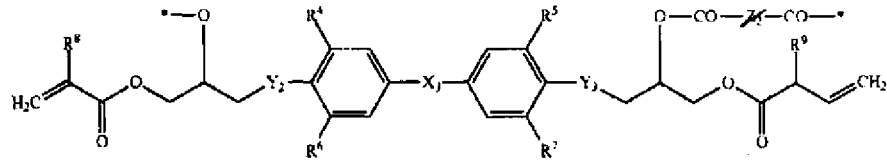

and should be depicted as: